United States Patent [19]

Janutka

[11] Patent Number: 4,488,068
[45] Date of Patent: Dec. 11, 1984

[54] BIDIRECTIONAL DRAIN TO DRAIN STACKED FET GATING CIRCUIT

[75] Inventor: William J. Janutka, West Allis, Wis.

[73] Assignee: Eaton Corporation, Cleveland, Ohio

[21] Appl. No.: 425,156

[22] Filed: Sep. 28, 1982

[51] Int. Cl.³ .................. H03K 17/08; H03K 17/10; H03K 17/687

[52] U.S. Cl. .................. 307/570; 307/577; 307/583; 307/585

[58] Field of Search ............. 307/241, 242, 570, 571, 307/572, 577, 582, 583, 584, 270, 304, 499, 501, 352, 353, 200 B, 579, 585; 357/23 GP

[56] References Cited

U.S. PATENT DOCUMENTS

| | | | |
|---|---|---|---|
| 3,651,342 | 3/1972 | Dingwall | 307/451 X |
| 3,789,244 | 1/1974 | Provanzano | 307/304 X |
| 4,015,146 | 3/1977 | Aihara et al. | 307/304 |
| 4,317,055 | 2/1982 | Yoshida et al. | 307/584 X |

OTHER PUBLICATIONS

Grayeff et al., "FETs Provide Current Limiting for Protection Against Shorts", Electronic Design 12, p. 160, Jun. 7, 1976.

Primary Examiner—Larry N. Anagnos
Assistant Examiner—David R. Bertelson
Attorney, Agent, or Firm—Andrus, Sceales, Starke & Sawall

[57] ABSTRACT

A bidirectional power FET circuit for AC application has a plurality of pairs of enhancement mode power FETs. Each pair has first and second power FETs connected drain to drain in series relation. The pairs are stacked in series between first and second main terminals. A plurality of gating circuits, one gating circuit for each power FET pair, are stacked in series for driving the power FET pairs sequentially into conduction from a single gate terminal.

12 Claims, 1 Drawing Figure

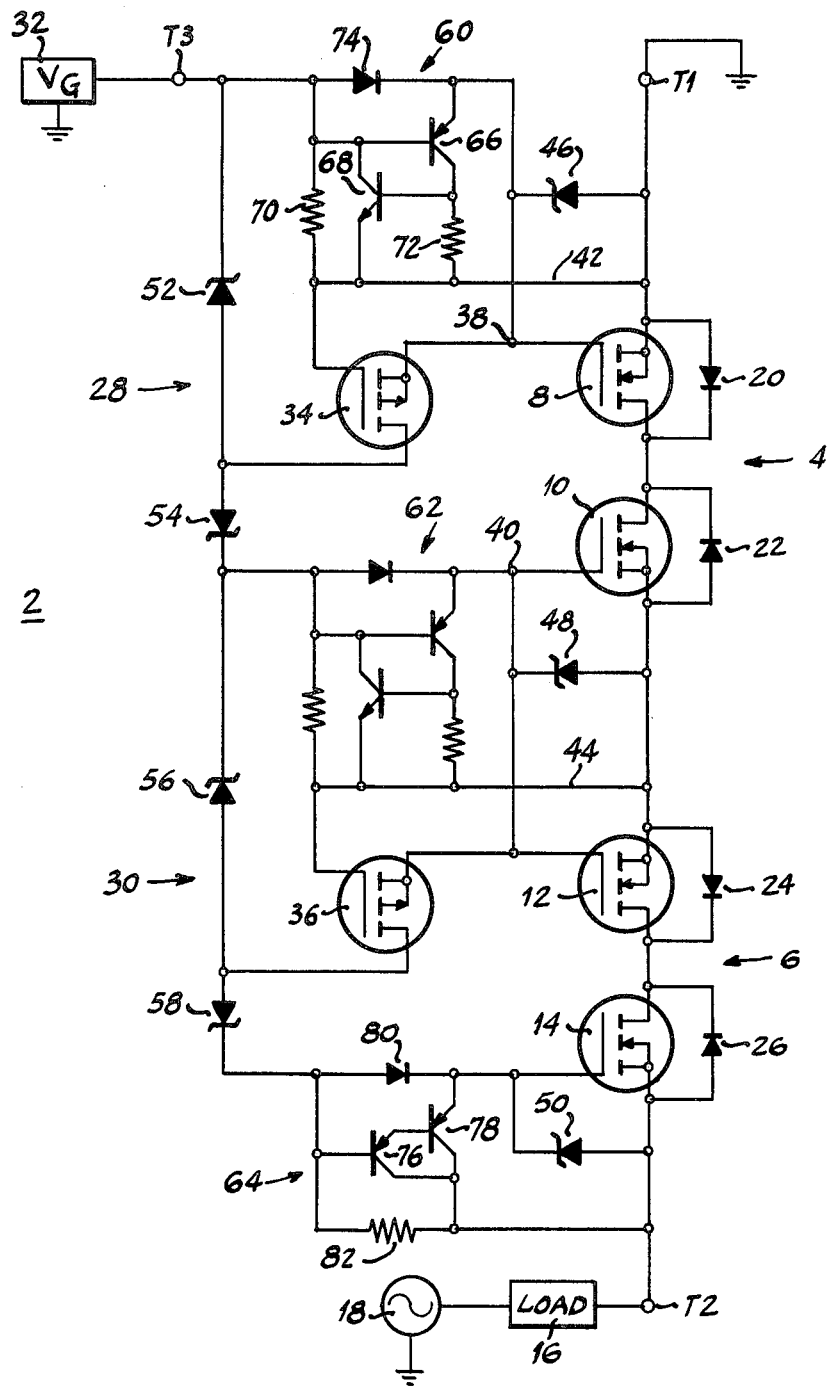

BIDIRECTIONAL DRAIN TO DRAIN STACKED FET GATING CIRCUIT

BACKGROUND AND SUMMARY

The invention relates to power FETs (field effect transistors), and more particularly to a plurality of FETs stacked in series and capable of handling bidirectional current, for AC application.

Power FETs are known in the art. A FET is unidirectional and conducts current from one main terminal to another in response to gate drive on a third terminal. This three terminal arrangement is widely accepted, and is compatible with standard circuit applications.

The stacking of power FETs in unidirectional applications is also known. Stacking is the interconnection of multiple devices in configurations that result in capabilities beyond those of a single device. The stacking of multiple power FETs in series results in higher voltage capability, and a better ratio of ON resistance to breakdown voltage. For example, connecting a pair of 100 volt devices in series results in a total voltage capability of 200 volts. The ON resistance in an individual power FET is proportional to the blocking voltage raised to the 2.6 power. Thus, doubling the blocking voltage in a single device would result in an ON resistance which is increased more than six times. Stacking of a pair of devices affords the increased voltage blocking capability but with lower ON resistance. Various problems encountered in stacking include voltage isolation, and differing gate triggering levels. Each of the gates wants to reference to a different level, but it is desirable to drive all the gates from the same source via a single gate terminal.

In order to control a load driven by an AC power source, a plural FET arrangement must be bidirectional, i.e. pass current in both directions. It is desirable that the plural FET circuit be a three terminal device which is compatible with most packaging environment.

The present invention addresses and solves the need for AC voltage capability in a series stack plural FET arrangement. The FETs are bidirectionally stacked drain to drain, and have a particularly simple and effective stacked gating arrangement.

BRIEF DESCRIPTION OF THE DRAWING

The single drawing is a circuit diagram of stacked gating circuitry for bidirectionally drain stacked FETs in accordance with the invention.

DETAILED DESCRIPTION

The drawing shows a three terminal bidirectional FET circuit 2 comprising a plurality of pairs 4 and 6 of enhancement mode power FETs connected in series between first and second main terminals T1 and T2. Each pair comprises first and second power FETs connected drain to drain in series relation, for example FETs 8 and 10 of pair 4, and FETs 12 and 14 of pair 6. My copending application Ser. No. 390,721, filed June 21, 1982, shows a pair of FETs connected drain to drain.

FIG. 1 shows the FET circuit connected across a load 16, an AC power source 18 and ground. The inherent reverse characteristic diodes 20, 22, 24 and 26 of the power FETs are also shown, as is known in the art. When the device is in the ON state, and terminal T2 is positive with respect to terminal T1, current flows from terminal T2 through diode 26, through FET 12, through diode 22, through FET 8 to terminal T1. When terminal T2 goes negative, current flows from T1 through diode 20, through FET 10, through diode 24, through FET 14 to terminal T2.

A plurality of gating circuits such as 28 and 30 are provided, one gating circuit for each pair of power FETs for driving the latter into conduction. The gating circuits are stacked in series for driving the pairs of power FETs sequentially into conduction from a single gate terminal T3 driven by gating voltage source 32. In preferred form, each circuit comprises a FET as shown at respective gating FETs 34 and 36. The first gating circuit 28 connects gate terminal T3 via connection 38 to the gate of the first power FET 8 of the first pair 4 and also connects the gate terminal T3 via connection 38 through first gating FET 34 and connection 40 to the gate of the second power FET 10 of the first pair 4. The second gating circuit 30 connects gating terminal T3 through the first gating FET 34 and via connection 40 the gate of the first power FET 12 of the second pair 6, and connects gate terminal T3 through first gating FET 34 and via connection 40 through second gating FET 36 to the gate of the second power FET 14 of the second pair 6.

In operation, a positive gating signal at T3 charges the gate of n channel power FET 8 to turn the latter ON. This positive signal at connection 38 also biases the source of p channel gating FET 34 positively with respect to the latter's gate which is referenced to ground via connection 42 to terminal T1. Gating FET 34 thus conducts and charges the gate of n channel power FET 10 through connection 40 rendering FET 10 conductive. The positive signal at point 40 also charges the gate of n channel power FET 12 rendering the latter conductive since its source is referenced to ground at T1 upon conduction of FETs 8 and 10. The positive signal at point 40 also biases the source of p channel gating FET 36 positively with respect to the latter's gate which is tied via connection 44 to the source of power FET 10, which source is at ground potential of terminal T1 upon conduction of FETs 8 and 10. Gating FET 36 is thus turned ON and current flows therethrough to the gate of n channel power FET 14 to turn the latter ON. Zener diodes 46, 48 and 50 provide gate to source protection for the power FETs. Zener diodes 52, 54, 56 and 58 provide overvoltage protection for the gating circuitry and power FETs when in reverse conduction. Zener diodes 54 and 58 also provide gate charging current when in forward conduction.

In preferred form, if there are n pairs of power FETs, then n+1 fast gate turn-off circuits such as 60, 62 and 64 are provided. These fast gate turn-off circuits provide fast discharge or depletion therethrough of power FET gate charge due to the gate to source capacitance of the power FETs, enabling fast turn-off. The first turn-off circuit 60 services the first power FET 8 of the first pair. The last turn-off circuit 64 services the second power FET 14 of the last pair. The remaining turn-off circuits such as 62 service the common source power FETs such as 10 and 12 in adjacent pairs such as 4 and 6, i.e. the remaining fast turn-off circuit such as 62 each service two power FETs such as 10 and 12.

Fast turn-off circuitry 60 is like that shown in my copending application Ser. No. 390,482, filed June 21, 1982, and facilitates fast turn-off by rapidly draining the stored energy in the gate to source capacitance of power FET 8. Fast turn-off circuitry 60 includes bipolar PNP transistor 66 whose emitter to base junction is forward biased at turn-off of power FET 8 due to the residual positive charge on the gate of the latter. Thus, when gate drive is removed from gate terminal T3, the base of transistor 66 is pulled negative with respect to its emitter by resistor 70, whereby transistor 66 goes into conduction. Current flowing through transistor 66 supplies base drive for an NPN bipolar transistor 68, driving the latter into conduction. Conduction of transistor 68 draws base current from transistor 66 whereby to latch transistors 66 and 68 into conduction in a regenerative loop. Conduction of transistors 66 and 68 discharge the gate of power FET 8 to thus facilitate faster turn-off thereof. Resistor 72 provides a means to unlatch transistors 66 and 68 when the charge on the gate of FET 8 has been depleted. Reverse blocking diode 74 insures turn-on of transistors 66 and 68.

Alternative fast turn-off circuitry for any or all of the fast turn-off circuits is shown at 64. Upon removal of gate drive, the base of PNP bipolar transistor 76 goes low with respect to its emitter which is connected to the base of another PNP bipolar transistor 78 in Darlington relation, such that transistors 76 and 78 are rendered conductive due to the relative positive charge on the emitter of transistor 78 which is connected to the gate of power FET 14. Reverse blocking diode 80 provides the requisite voltage drop between the emitter of transistor 78 and the base of transistor 76, and resistor 82 provides the requisite return path, to enable turn-on of Darling transistor pair 76 and 78, to thus quickly discharge the residual positive stored charge in the gate to source capacitance in power FET 14.

In other embodiments, the fast turn-off circuitry 60, 62, and/or 64 may be like that shown in my copending application Ser. Nos. 390,720 or 390,481, filed June 21, 1982. In the former, a fast turn-off circuit is provided by a JFET in the gate circuit of the power FET which is connected to the same gate drive terminal as the power FET. The JFET becomes conductive upon turn-off of the power FET due to removal of gate drive. Conduction of the JFET provides faster discharge therethrough of residual stored charge on the power FET gate, whereby to facilitate faster turn-off. A zener diode is connected in the gating circuitry and has a greater breakover voltage than the pinch-off voltage of the JFET, such that during turn-on, gate drive first pinches off the JFET and then charges up the power FET gate to drive the power FET into conduction. In the latter, nonregenerative bipolar transistor means is provided in the gate circuit of the FET to facilitate fast turn-off without reverse gating current and its attendant auxiliary power supply.

It is recognized that various modifications are possible within the scope of the appended claims.

I claim:
1. A bidirectional FET circuit comprising:
a plurality of pairs of enhancement mode power FETs, each pair comprising first and second FETs of like channel type connected drain to drain in series relation, said pairs connected in series between first and second main power terminals, current conduction in one direction flowing through the series connection of the forward biased substrate-drain PN junction of said first FET and the drain-source current path of said second FET, and in the opposite direction through the series connection of the forward biased substrate-drain PN junction of said second FET and the drain-source current path of said first FET; and
a plurality of gating circuits, one gating circuit for each said pair of power FETs for driving the latter into conduction.

2. The invention according to claim 1 wherein said gating circuits are stacked in series for driving said pairs of said power FETs sequentially into conduction from a single gate terminal, said gating circuits being serially connected between said gate terminal and the gate of said second of the last pair.

3. A bidirectional FET circuit comprising:
a plurality of pairs of enhancement mode power FETs, each pair comprising first and second FETs connected drain to drain in series relation, said pairs connected in series between first and second main power terminals, current conduction in one direction flowing through the series connection of the forward biased substrate-drain PN junction of said first FET and the drain-source current path of said second FET, and in the opposite direction through the series connection of the forward biased substrate-drain PN junction of said second FET and the drain-source current path of said first FET; and
a plurality of gating circuits, one gating circuit for each said pair of power FETs for driving the latter into conduction, wherein:
said gating circuits are stacked in series for driving said pairs of power FETs sequentially into conduction from a single gate terminal, said gating circuits being serially connected between said gate terminal and the gate of said second FET of the last pair;
the first of said gating circuits connects said gate terminal to the gate of the first power FET of the first of said pairs and connects said gate terminal through a first gating FET to the gate of the second power FET of said first pair; and
the second of said gating circuits connects said gating terminal through said first gating FET to the gate of the first power FET of the second of said pairs and connects said gate terminal through said first gating FET and through a second gating FET to the gate of the second power FET of said second pair.

4. The invention according to claim 3 wherein:
said first gating FET has a gate connected to said first main terminal, one of its source and drain connected to said gate terminal and to said gate of said first power FET of said first pair, and the other of its source and drain connected to said gate of said second power FET of said first pair and to said gate of said first power FET of said second pair; and
said second gating FET has a gate connected to the source of said second power FET of said first pair and connected to the source of said first power FET of said second pair, one of its source and drain connected to said gate of said first power FET of said second pair, and the other of its source and drain connected to said gate of said second power FET of said second pair.

5. The invention according to claim 4 comprising a pair of zener diodes for each gating FET providing overvoltage protection for said gating FETs and said power FETs when in reverse conduction, and one zener diode of each pair also providing gate charging current when in forward conduction, to provide a dual function, said zener diodes being connected serially between said gate terminal and said gate of said second power FET of said second pair, a node between the first and second pair of zener diodes being connected to said gate of said second power FET of said first pair, a node between said zener diodes of said first pair being connected to said first gating FET, a node between said zener diodes of said second pair being connected to said second gating FET.

6. The invention according to claim 5 wherein the first zener diode of the first pair has its cathode connected to said gate terminal and its anode connected to the drain of said first gating FET, the second zener diode of the first pair has its anode connected to said drain of said first gating FET and its cathode connected to said gate of said second power FET of said first pair and said gate of said first power FET of said second pair, the first zener diode of the second pair has its anode connected to the drain of said second gating FET and has its cathode connected to said cathode of said second zener diode of said first pair, the second zener diode of said second pair has its anode connected to said drain of said second gating FET and has its cathode connected to said gate of said second power FET of said second pair.

7. The invention according to claim 3 comprising n said pairs of power FETs and comprising n+1 fast gate turn-off circuits;

the first of said fast gate turn-off circuits being connected between said gate of said first power FET of said first pair and said first main terminal, and coupled to said gate terminal and conductive upon removal of gate drive to deplete residual capacitive gate charge therethrough and facilitate faster FET turn-off;

the second of said fast gate turn-off circuits being connected between a point common to said gate of said second power FET of said first pair and said gate of said first power FET of said second pair and a point common to the source of said second power FET of said first pair and the source of said first power FET of said second pair, and coupled to said gate terminal and conductive upon removal of gate drive to deplete residual capacitive gate charge therethrough and facilitate faster FET turn-off; and the last of said fast gate turn-off circuits being connected between the gate of said second power FET of the last of said pair and said second main terminal, and coupled to said gate terminal and conductive upon removal of gate drive to deplete residual capacitive gate charge therethrough and facilitate faster FET turn-off.

8. The invention according to claim 7 wherein each said fast gate turn-off circuit comprises transistor means connected between respective FET gates and sources and being nonconductive in response to gate drive to respective said FETs to prevent draining of said gate drive away from respective said FET gates.

9. The invention according to claim 8 wherein said last mentioned transistor means comprises a pair of regeneratively coupled bipolar transistors driven into latched conduction by the residual stored charge on respective said FET gates in combination with the absence of gate current from said gate terminal.

10. The invention according to claim 9 wherein said bipolar transistors comprise PNP transistor having its emitter connected to respective said FET gates and having its base connected to said gate terminal, and an NPN transistor having its base connected to the collector of said PNP transistor, its collector connected to the base of said PNP transistor, and its emitter connected to respective said power FET sources.

11. The invention according to claim 8 wherein said last mentioned transistor means comprises as pair of bipolar transistors connected in Darlington relation between respective said FET gates and FET sources, and having a base connected to said gate terminal.

12. The invention according to claim 11 wherein said Darlington transistor pair comprises as first PNP transistor having its emitter connected to respective said FET gates and its collector connected to respective said FET sources, and a second PNP transistor having its emitter connected to the base of said first PNP transistor, its base connected to said gate terminal, and its collector connected to said respective FET sources.

* * * * *